United States Patent [19]
Yang et al.

[11] Patent Number: 6,136,657
[45] Date of Patent: Oct. 24, 2000

[54] METHOD FOR FABRICATING A SEMICONDUCTOR DEVICE HAVING DIFFERENT GATE OXIDE LAYERS

[75] Inventors: Won-Suk Yang; Chang-Hyun Cho, both of Seoul; Ki-Nam Kim, Kyunggi-do, all of Rep. of Korea

[73] Assignee: Samsung Electronics Co., Ltd., Suwon, Rep. of Korea

[21] Appl. No.: 09/315,341

[22] Filed: May 20, 1999

[30] Foreign Application Priority Data

May 20, 1998 [KR] Rep. of Korea ............ 98-18168

[51] Int. Cl.⁷ .......................... H01L 21/336; H01L 21/31
[52] U.S. Cl. .................. 438/303; 438/301; 438/305; 438/763; 438/773; 438/981
[58] Field of Search .................. 438/301, 303, 438/305, 763, 773, 981

[56] References Cited

U.S. PATENT DOCUMENTS 5,937,310  8/1999  Gardner et al. ............... 438/440

*Primary Examiner*—John F. Niebling
*Assistant Examiner*—Alexander G. Ghyka
*Attorney, Agent, or Firm*—Jones Volentine, LLC

[57] ABSTRACT

A method for fabricating a semiconductor device with different gate oxide layers is provided. In this method, oxidation is controlled in accordance with the active area dimension so that the oxide grows more thinly at a wider active width in a peripheral region, and grows more thickly at a narrower active width in a cell array region. In this method, a gate pattern is formed over a semiconductor substrate having different active areas. Gate spacer are formed and an active-dimension-dependant oxidation process is then performed to grow oxide layers of different thicknesses in the cell array region and the peripheral region.

11 Claims, 10 Drawing Sheets

METHOD FOR FABRICATING A SEMICONDUCTOR DEVICE HAVING DIFFERENT GATE OXIDE LAYERS

This application relies for priority upon Korean Patent Application No. 98-18168, filed on May 20, 1998, the contents of which are herein incorporated by reference in their entirety.

FIELD OF THE INVENTION

The present invention relates to a method for manufacturing semiconductor devices, and more particularly to a method for fabricating a semiconductor device having different gate oxide layers in a single chip.

BACKGROUND OF THE INVENTION

Recent trends toward high density integrated circuits has increased chip density while simultaneously decreasing both the size of the transistors built on the chip and the gate oxide thicknesses of these transistors.

FIG. 1 schematically shows the relationship between the electrical field (in MV/cm) and gate oxide thickness (in Å) with respect to high voltage logic devices and normal voltage logic devices. As can be seen by FIG. 1, the possibility of a gate oxide breakdown increases with a decrease in gate oxide thickness. To avoid this problem, current designs have reduced device supply voltages ($V_{DD}$), which are required to operate a chip. Because a reduction in supply voltage causes a degradation of both device power and speed, however, the thickness of the gate oxide layer in the device must then be reduced as well, to adjust for this lower power and speed.

As is well known, transistor characteristics can be increased by reducing gate oxide thickness while keeping the supply voltage at a constant level. On the other hand, power consumption can be reduced by decreasing the supply voltage while keeping the gate oxide thickness at a constant level. Therefore, the gate oxide thickness must be reduced without causing an oxide breakdown, while maintaining a constant electric field. This is performed in accordance with the so-called "constant electric field scaling law."

Semiconductor memory devices are generally divided into a cell array region and a peripheral region. The cell array region includes a plurality of memory cells in a matrix, and the peripheral region includes circuitry to operate the memory cells.

It is a recent trend in the DRAM or MDL industry, however, that the proportion of the chip area occupied by a cell array is increasing as compared to the chip area occupied by peripheral circuitry. Therefore, if the gate oxide layer is formed to have the same thickness throughout the entire chip, all of the gate oxides in at the cell array region will be subject to suffering from breakdown. Furthermore, since a cell array voltage ($V_{HDD}$) that is supplied to the cell array interior exceeds the supply voltage ($V_{DD}$), the electric field applied to the cell array interior is increased, which intensifies the possibility of a gate oxide breakdown.

Since the cell density in the cell array region has historically increased four times or each generation of device, a controlled threshold voltage is required to protect against sub-threshold leakage and gate length variation. In other words, a short channel effect margin is required. In addition, it would also be desirable to increase a drain saturation current ($I_{DSAT}$) in the peripheral region.

To overcome problems mentioned above, several methods have been proposed. One approach is to increase the doping concentration in the channel region so as to adjust the threshold voltage in consideration of the short channel effect. The increase in the doping concentration, however, decreases the breakdown margin and increases the threshold voltage variation for a given gate length. In other words, gate length margins are reduced.

Another approach is to fabricate the cell array region and peripheral region on different chips, not on a single chip. This method, however, has a disadvantage of increasing process complexity and is not compatible with low cost fabrication.

SUMMARY OF THE INVENTION

The present invention was made in view of the above problem, and it is therefore an object of the invention to provide a method for forming different gate oxide layers in a single chip, and more particularly to form different gate oxide layers after the formation of a gate electrode. A key feature of this invention is to form different gate oxide layers through an oxidation process that is dependent on the width of an active region. The active-width-dependent oxidation process is preferably carried out after the formation of the transistor.

In other words, different sized active regions (e.g., a cell array region and a peripheral region) are defined in and on the semiconductor substrate. A first thin gate oxide layer is formed on the overall active regions with uniform thickness. Different gate patterns are formed over the thin oxide layer of the active regions. In a narrow active region (i.e., a cell array region) gate patterns are formed to have a narrow distance between adjacent gate pattern, while in a wide region (i.e., a peripheral region) gate patterns are formed to have a wide distance between adjacent gate patterns.

Gate spacers are formed on lateral edges of the patterned gates. A critical wet oxidation is carried out to grow a thin oxide layer in the narrow active region (i.e., the cell array region). The wet oxidation process allows for gate oxide growth to a greater extent in the narrow active region (i.e., the cell array region) than in the wide active region (i.e., the peripheral region). As a result, different gate oxide layers are formed in one chip, i.e., a thick gate oxide layer is formed in the cell array region and a relatively thin gate oxide layer is formed in the peripheral region.

In this process there are various oxidation parameters such as stress caused by volume expansion, reaction ration, reflux, and oxidant diffusivity path. Of these, the oxidant diffusivity path is the most critical parameter.

During the oxidation process, oxidation along the gate length does not easily occur, while the oxidant easily diffuses through a gate that overlaps the field oxide layer. Therefore, if the active width is narrow (as in the cell array region), the oxidant from the gate width direction (i.e., from the field oxide) grows thickly the thin gate oxide layer. On the other hand, if the active width is wide (as in the peripheral region), the amount of the oxidant from the gate width direction is small considering the active size, so that the thickness variation of the thin gate oxide layer is negligible. Accordingly, different gate oxide layers are formed in one chip.

The above and other objects in accordance with the present invention may be realized by forming a field oxide layer to define different size active regions. Herein, different size means that the size of one active region is relatively larger than other active regions. For example, relatively small active region may be a cell array region and larger active region may be peripheral region. A thin layer of gate oxide is preferably formed over entire semiconductor substrate with a uniform thickness of about 100 Å or less. Gate patterns are then formed over the thin gate oxide layer. The gate patterns in the cell array region have a relatively small pattern width and small distance between each other, as compared to those in the peripheral region.

A dry etching used for the formation of the gate patterns can cause substrate damage and gate oxide encroachment in the bottom edges of the gate patterns. To cure this dry etching damage, a dry oxidation process is preferably carried out to form a first oxide layer on the semiconductor substrate outside of the gate patterns. This will actually increase the thickness of the gate oxide layer in areas where the gate oxide layer is exposed. In addition, if the gate patterns include the polysilicon layer, the first oxide layer will also be formed on the lateral edges of the portions of the gate patterns that comprise polysilicon. Preferably the gates include polysilicon.

A chemical etching or wet etching is carried out to remove a partial thickness of the first oxide layer to eliminate the influence of the first oxide layer (i.e., to reduce oxidant diffusivity) during an active width dependent oxidation process. Preferably, the etching of the first oxide layer is carried out to leave only about 50 Å or less of the first oxide layer. Insulating spacers are then formed on lateral edges of the gate patterns.

The critical-active-width dependent oxidation process is then carried out to form different gate oxide layers in the active regions. This is preferably accomplished by wet oxidation in the temperature range from 750° C. to 850° C. During this wet oxidation, the oxidant diffusivity from the gate patterns width directions (which overlap the field oxide layer) greatly affect the oxidation process, since the oxidant diffusivity from the first oxide layer along the gate length direction (i.e., the active length direction) is negligible in both the cell array region and peripheral region. Accordingly, the thin gate oxide layer in the cell array region grows thickly in both gate width and length directions due to its narrow active width. On the other hand, the thin gate oxide layer grows very thin in the peripheral regions due to its wide active width. Therefore, different gate oxide layers are formed in on chip.

BRIEF DESCRIPTION OF THE DRAWINGS

The invention may be understood and its objects will become apparent to those skilled in the art by reference to the accompanying drawings as follows.

DETAILED DESCRIPTION OF THE PREFERRED EMBODIMENTS

A preferred embodiment of the present invention will now be described with reference to the accompanying drawings. The present invention relates to a method for forming different gate oxide layers in a single chip, particularly forming two different gate oxide layers having a thickness gap of more than 30%.

Figure 1:
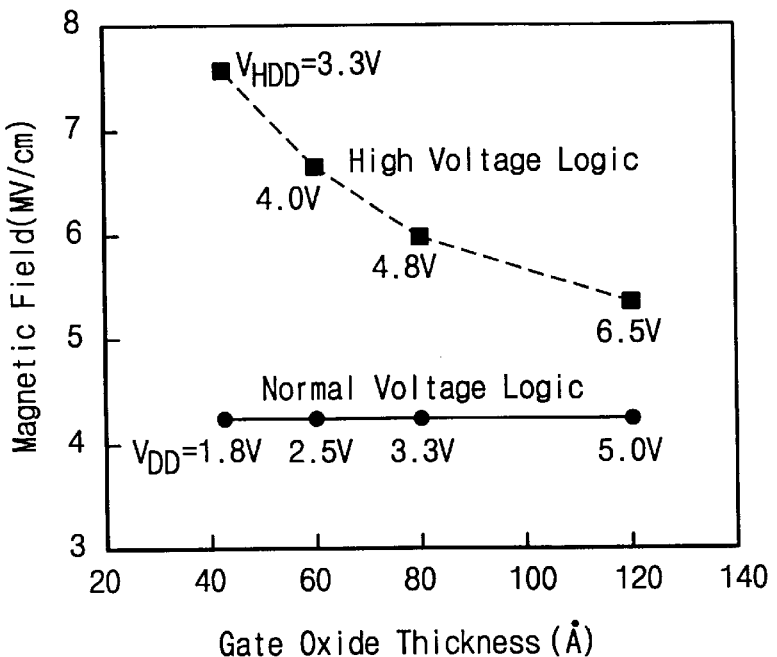
FIG. 1 schematically shows the relationship between electrical field (MV/cm) and gate oxide thickness (Å) with respect to a high voltage logic device and a normal voltage logic device.
Figure 2:
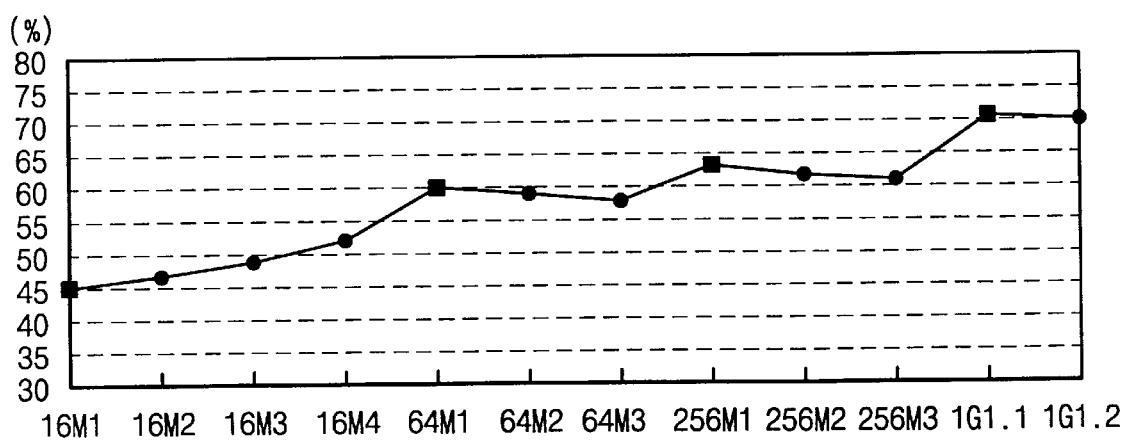
FIG. 2 shows the relationship between the degree of cell density and cell efficiency.

FIG. 2 shows the relationship between the degree of cell density and cell efficiency. As can be seen by FIG. 2, the degree of cell density is proportional to cell efficiency. As the cell density increases, the cell efficiency also increases. This is because as the cell density increases in the cell array region, the same circuit is used in the peripheral region. As the cell efficiency increases, the gate oxide reliability arises easily in the cell array region due to larger electrical filed than in the peripheral region. Therefore, a device is needed that has different-sized gate oxide layers at different portions of the device, i.e., a thicker gate oxide in the cell array region and a thinner gate oxide layer in the peripheral region.

The present invention provides a high voltage device and a normal voltage device with a more than 30% threshold voltage difference between the two devices on a single chip. To this end, the high voltage device has a thicker gate oxide and the normal voltage device has a relatively thin gate oxide. The effective gate oxide layer is completely formed on the chip after completely forming the gate pattern.

Figure 3A:
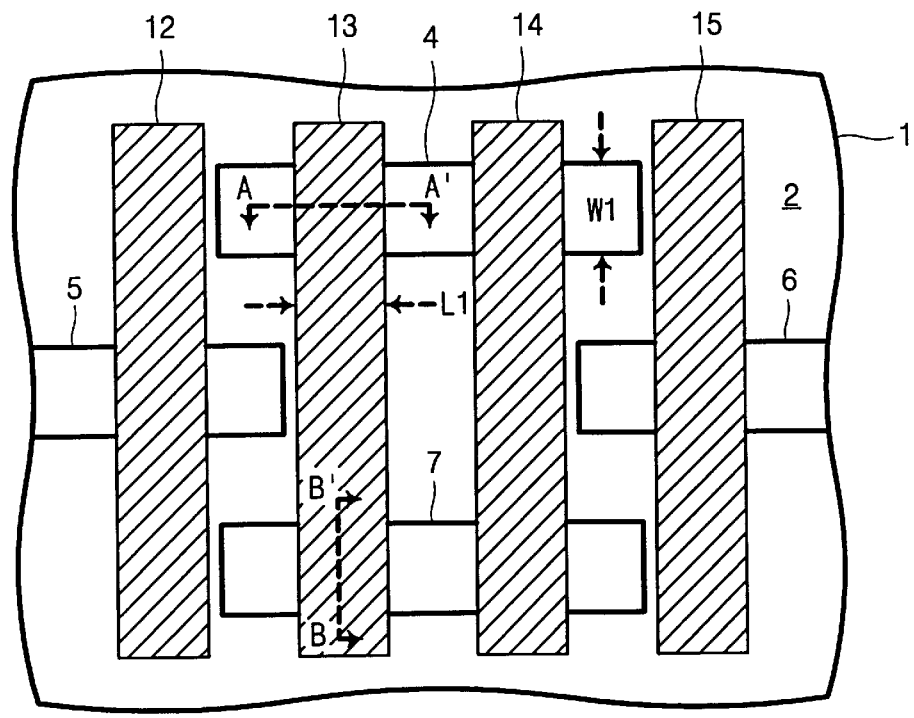
FIGS. 3A and 3B are top plan views schematically showing active regions and patterned gates in the cell array region and peripheral region, respectively.
Figure 3B:
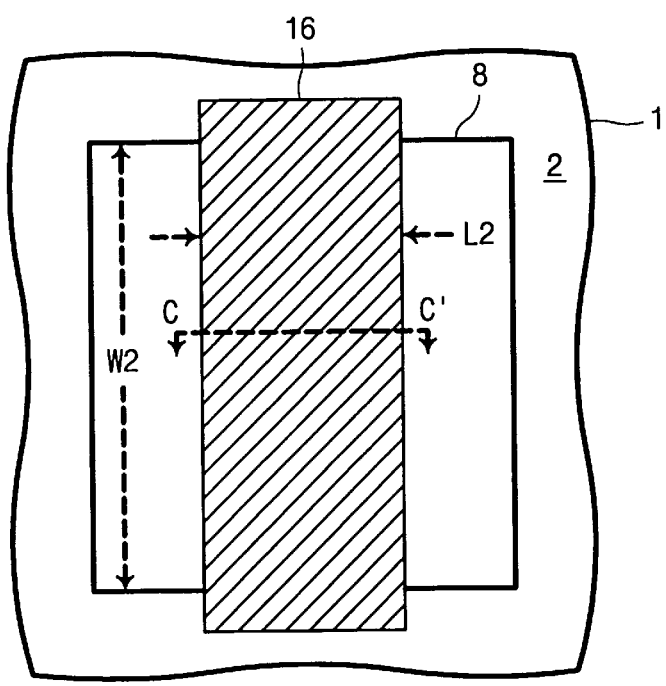

FIGS. 3A and 3B are top plan views schematically showing a semiconductor substrate 1 having active regions 4 to 7 and gate patterns 12 to 15 in the cell array region, and an active region 8 and a gate pattern 16 in the peripheral region, according to a preferred embodiment of the present invention. It is noted that FIG. 3A and FIG. 3B are top plan views of the same semiconductor substrate though provided separately from each other.

Referring to FIGS. 3A and 3B, a plurality of active regions 4 to 8 are formed on the semiconductor substrate. The term "active width" as used hereinafter means the distance of the active region overlapped by the running gate patterns and has the same meaning as the gate width. The term "active length" as used herein mean the distance of the active region intersecting the running gate patterns. The active regions 4 to 7 in the cell array region are preferably formed to have active widths (see reference numeral W1) of about 0.2 microns or less. On the other hand, the active region 8 in the peripheral region is preferably formed to have an active width (see reference numeral W2) more than two times as large as that in the cell array region, i.e., 0.4 microns or more, more preferably 1.0 microns or more with the same active length. In FIGS. 3A and 3B, the reference numeral 2 represents the field oxide layer, and completely obscures the substrate 1 in the top plan views of FIGS. 3A and 3B.

In FIGS. 3A and 3B, the reference numerals W1 and W2 represent active widths, and the reference numerals L1 and L2 represent reference lengths.

Figure 4A:
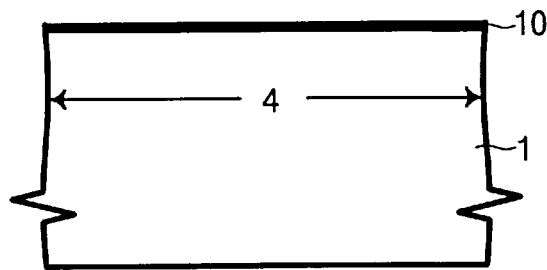
FIGS. 4A to 4C are cross-sectional views of a semiconductor substrate having a gate oxide layer, respectively taken along the A–A' line, the B–B' line, and the C–C' line of FIGS. 3A and 3B before the formation of the patterned gates.
Figure 4B:
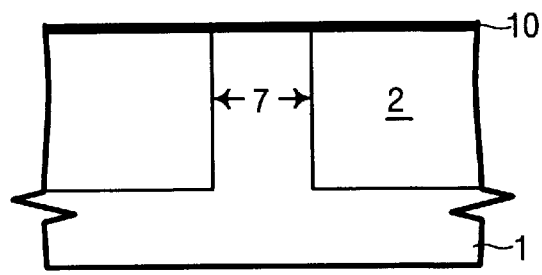
Figure 4C:
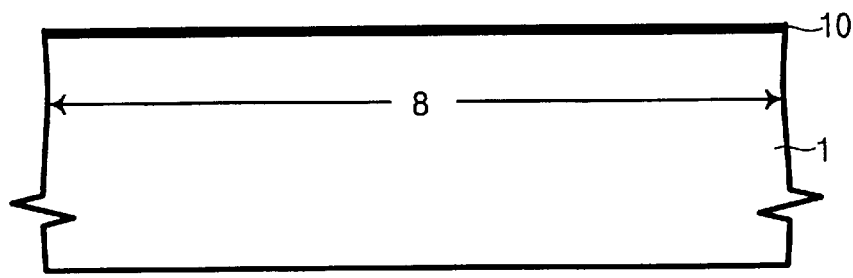

FIGS. 4A to 4C are cross-sectional views of the semiconductor substrate having a ate oxide layer, taken respectively along the A–A' line, the B–B' line, and the C–C' line of FIGS. 3A and 3B before the formation of the patterned gates. The field oxide layer 2 is formed to define active regions 4 to 8 on the semiconductor substrate 1 in the cell array region and in the peripheral region. The active regions 4 to 7 in the cell array region are preferably formed to have a relatively narrow width of 0.2 microns or less as compared to the active region 8 in the peripheral region. More than 90% of the active regions 8 in the peripheral region are preferably formed to have an active width exceeding two times as large as those in the cell array region, i.e., preferably more than 0.4 microns. On the other hand, the active regions 4 to 7 in the cell array region preferably have the same active length as the active region 8 in the peripheral region. The field oxide layer 2 is preferably formed by a conventional method such as a trench isolation technique. A gate oxide layer 10 is preferably formed over the entire surface of the semiconductor substrate 1 to a thickness of about 100 Å or less.

Figure 5A:
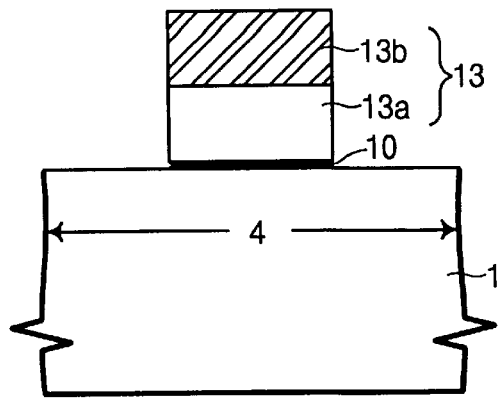
FIGS. 5A to 5C are cross-sectional views respectively taken along the A–A' line, the B–B' line, and the C–C' line of FIGS. 3A and 3B after the formation of the patterned gates.
Figure 5B:
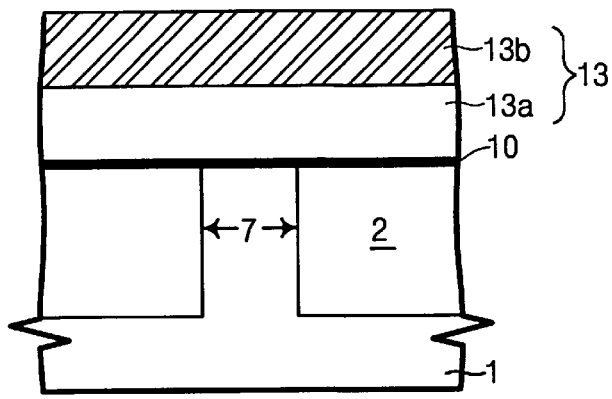
Figure 5C:
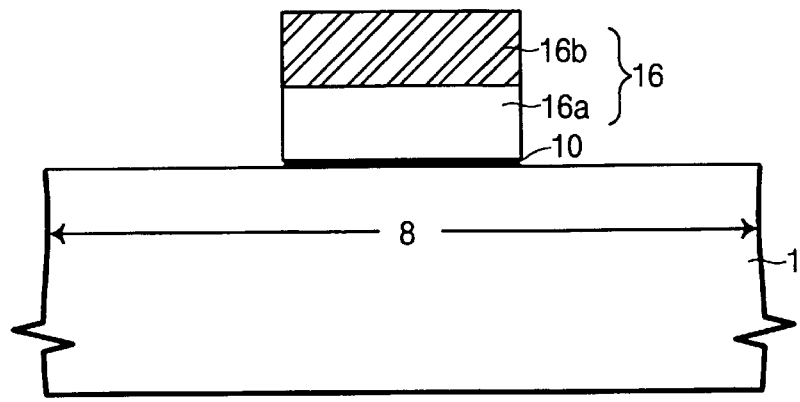

Referring to FIGS. 5A to 5C, gate patterns 13 and 16 are formed intersecting the active regions 4, 7, and 8. The gate patterns 13 and 16 are preferably formed by a process sequence of depositing doped polysilicon layers 13a and 16a, silicide layers (not shown) such as $WSi_x$, $TiSi_x$, or $MoSi_x$, hard masks 13b and 16b such as $Si_3N_4$, HTO (high temperature oxide), or PE-CVD (plasma enhanced chemical vapor deposition), and anti-reflection layers (not shown), and then patterning them to a desired configuration by a photoetching process. The hard mask preferably serves as both an etching mask and an ion implanting mask. The gate pattern 13 in the cell array region preferably has a size (or length) of about 0.2 microns or less and the gate pattern 16 in the peripheral region preferably has a size at least one and a half times as large as that in the cell array region, for example, from 0.2 microns to 2.0 microns, depending upon the size of the gate pattern 13 in the cell array region. More preferably, the gate pattern 16 in the peripheral region has ranges in size from 0.2 microns to 1.0 microns. The gate pattern 13 in the cell array region preferably is formed to have a size of about 0.2 to 3.0 microns, and moist of them have a size of about 0.2 to 2.0 microns.

Figure 6A:
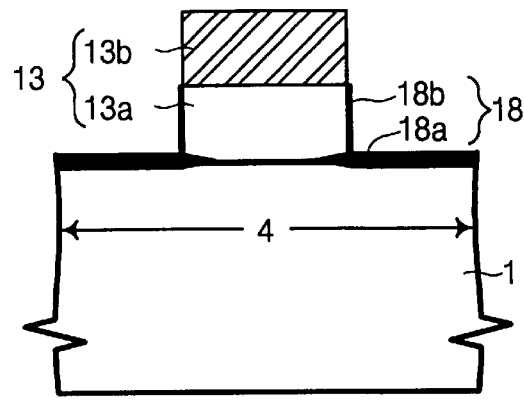
FIGS. 6A to 6C are cross-sectional views respectively taken along the A–A' line, the B–B' line, and the C–C' line of FIGS. 3A and 3B, which illustrate a process step subsequent to that shown in FIGS. 5A to 5C wherein a dry oxidation is carried out.
Figure 6B:
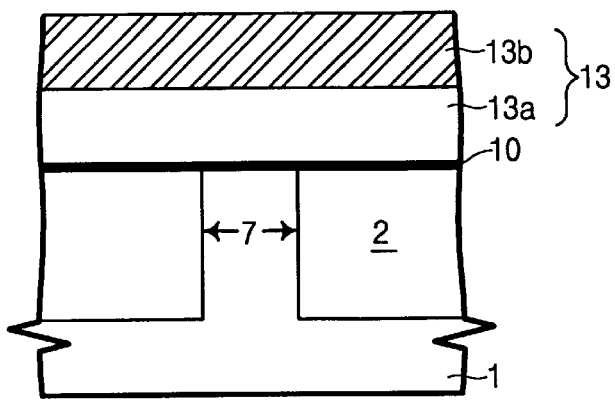
Figure 6C:
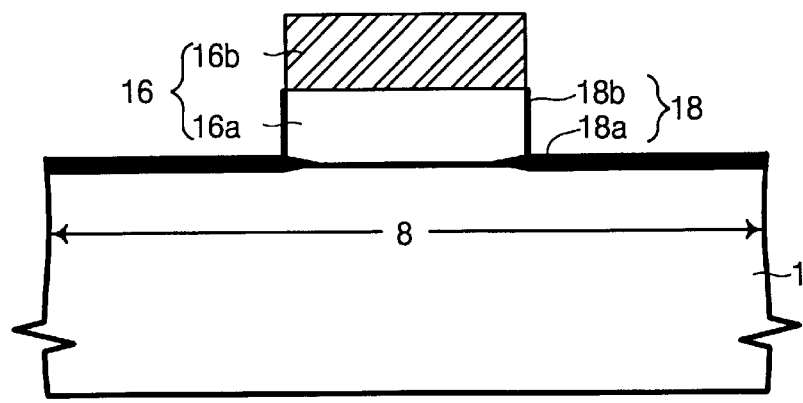

The anisotropic dry etching for gate patterning can cause substrate damages and gate oxide encroachment at the bottom edges of the gate pattern, however. To cure the damage of the substrate and the gate oxide layer, dry oxidation is often carried out to form oxide layers 18a and 18b on the lateral edges of the gate patterns and on the surface of the semiconductor substrate not covered by the gate patterns 13 and 16, as shown in FIGS. 6A to 6C. The portion of the oxide layers 18a formed over the surface of the substrate 1 includes a portion of the gate oxide layer 10 as well as additionally-grown oxide. It is noted that a bird's beak phenomenon may occur in the bottom edges of the gate pattern so that the oxide layer 18a grows more thickly there than in any other part of the device.

Figure 7A:
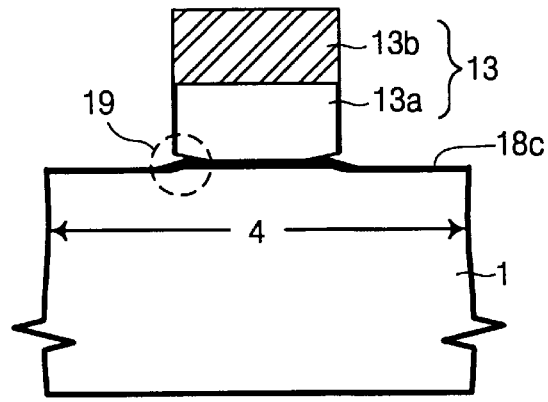
FIGS. 7A to 7C are cross-sectional views respectively taken along the A–A' line, the B–B' line, and the C–C' line of FIGS. 3A and 3B, which illustrate a process step subsequent to that shown in FIGS. 6A to 6C wherein a wet cleaning is carried out.
Figure 7B:
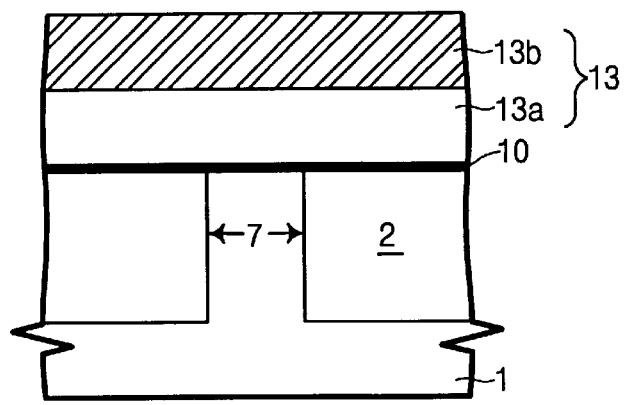
Figure 7C:
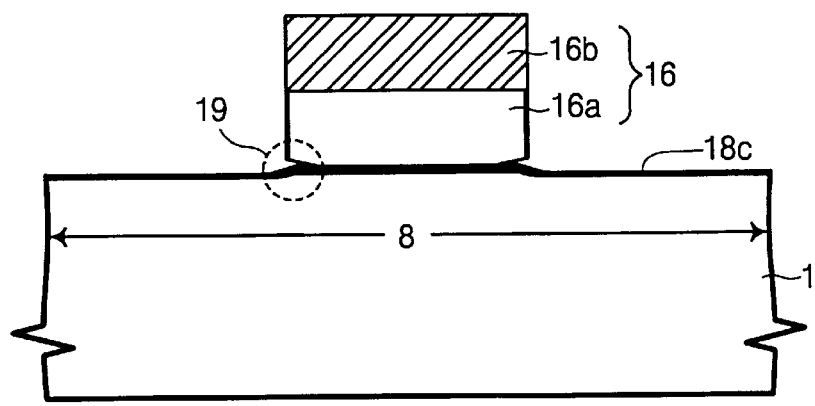

Chemical etching or wet etching is then carried out to remove a partial thickness of the oxide layer 18 to eliminate the influence of the oxide layer 18 (i.e., to reduce oxidant diffusivity) during an active-width-dependent oxidation process. A partial thickness of the oxide layer 18 is removed to ensure that a remaining thickness is thin as compared to the gate oxide layer 10. Preferably, the etching of the oxide layer 18 is carried out to leave about 50 Å or less, as shown in FIGS. 7A to 7C (see reference numeral 18c). This chemical or wet etching may cause an oxide layer encroachment 19 at the bottom of the gate pattern 13 and 16.

Figure 8A:
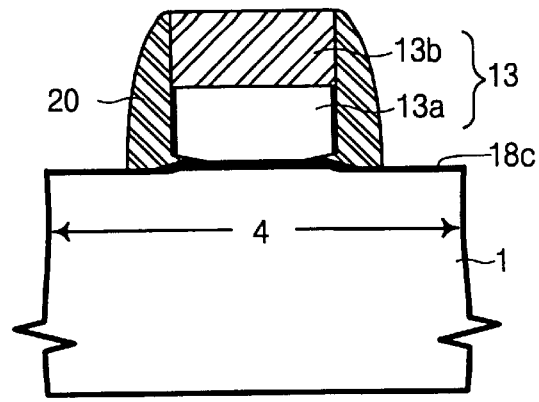
FIGS. 8A to 8C are cross-sectional views respectively taken along the A–A' line, the B–B' line, and the C–C' line of FIGS. 3A and 3B, which illustrate a process step subsequent to that shown in FIGS. 7A to 7C wherein insulating spacers are formed on the lateral edges of the patterned gates.
Figure 8B:
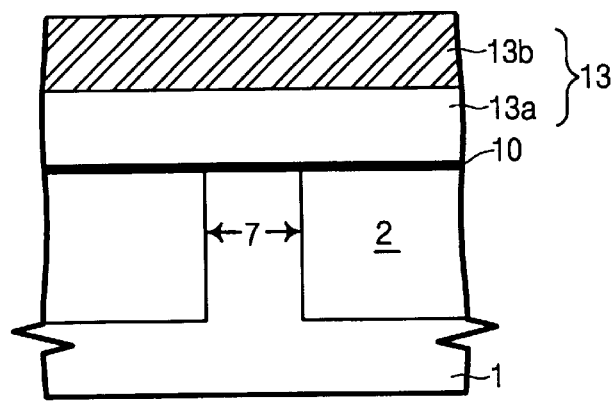
Figure 8C:
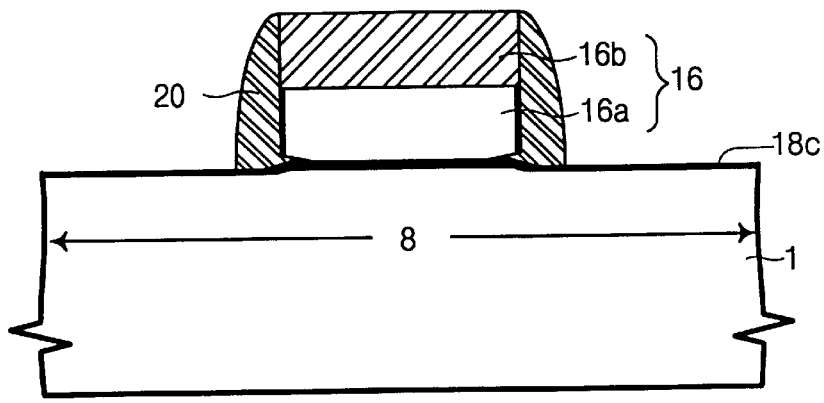

Referring to FIGS. 8A to 8C, insulating spacers 20 are then formed by a conventional process on lateral edges of the gate patterns 13 and 16. Any suitable insulating material, e.g., an oxide layer, may be selected for the insulating spacers 20. This insulating spacers 20 serve the dual purpose of being an oxidation barrier layer in the subsequent wet oxidation and being a self-aligned mask for implantation.

Figure 9A:
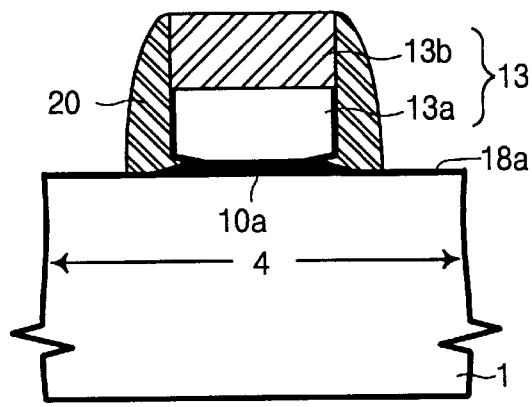
FIGS. 9A to 9C are cross-sectional views respectively taken along the A–A' line, the B–B' line, and the C–C' line of FIGS. 3A and 3B, which illustrate a process step subsequent to that shown in FIGS. 8A to 8C wherein wet oxidation process is carried out to form different gate oxide layers.
Figure 9B:
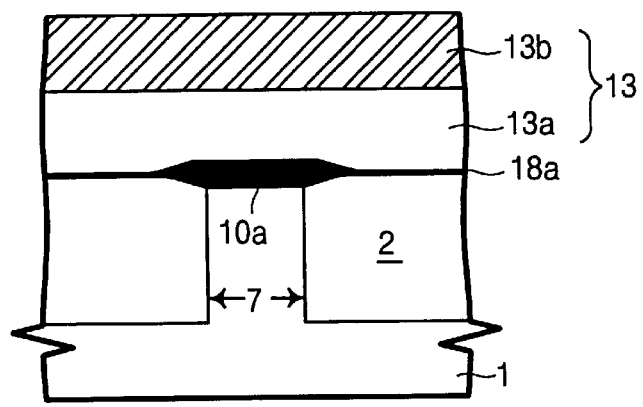
Figure 9C:
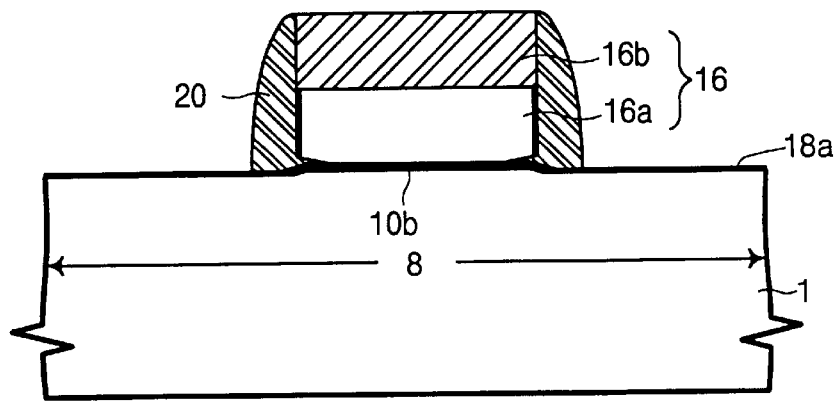

The formation of different gate oxide layers will be addressed with reference to FIGS. 9A to 9C. The critical active-width-dependent oxidation process is carried out over the entire semiconductor substrate to form different gate oxide layers 10a and 10b. The active-width-dependent oxidation is preferably carried out by wet oxidation process in the temperature range of 750° C. to 850° C. This wet oxidation allows different oxide layer growth according to the size of the active width. In this process, an oxide layer grows thickly in the cell array region while it grows less thickly in the peripheral region. This is because, during this wet oxidation, oxidant diffusivity from the thick field oxide layer along the active width direction greatly affects the oxidation process while the oxidant diffusivity from the oxide layer along the gate length direction (i.e., active length direction) is negligible in both the cell array region and the peripheral region. In other words, the oxidants from the gate length direction greatly affects the oxidation in the cell region with its small active areas while they effect much less the oxidation in the peripheral region with its large active areas. Accordingly, the thin gate oxide layer in the cell array region grows thickly (see reference numeral 10a) in both gate width and length directions due to its narrow active width. On the other hand, the thin gate oxide layer does not grow as thickly (see reference numeral 10b) in the peripheral regions due to its wide active width. As a result, gate oxide layers with different widths are formed in on chip.

Figure 10A:
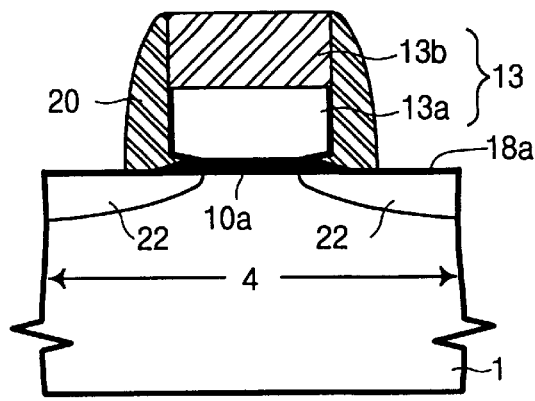
FIGS. 10A to 10C are cross-sectional views respectively taken along the A–A' line, the B–B' line, and the C–C' line of FIGS. 3A and 3B, which illustrate a process step subsequent to that shown in FIGS. 9A to 9C wherein source/drain regions are completely formed.
Figure 10B:
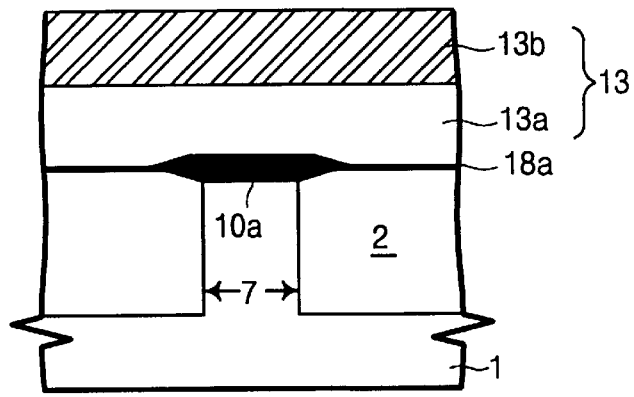
Figure 10C:
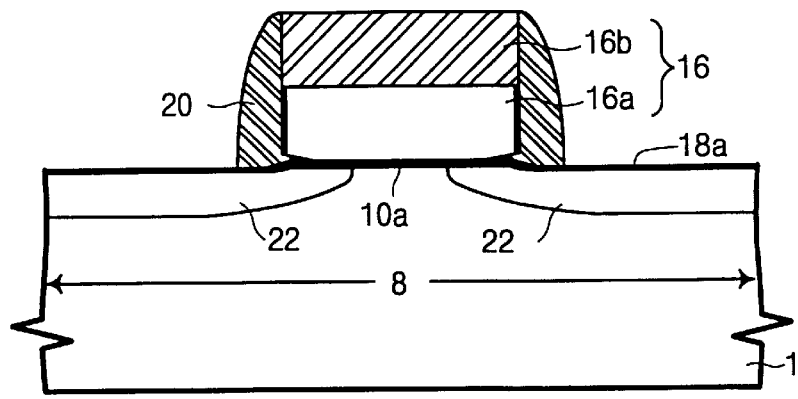

Using the insulating spacers 20 as a mask, high concentration impurities are then implanted into the substrate to completely form source/drain region 22 as shown in FIGS. 10A to 10C. As is well known in the art, the implantation of low concentration impurities may be carried out before the formation of the insulating spacers 20 to form a LDD (lightly doped drain) structure.

Figure 11:
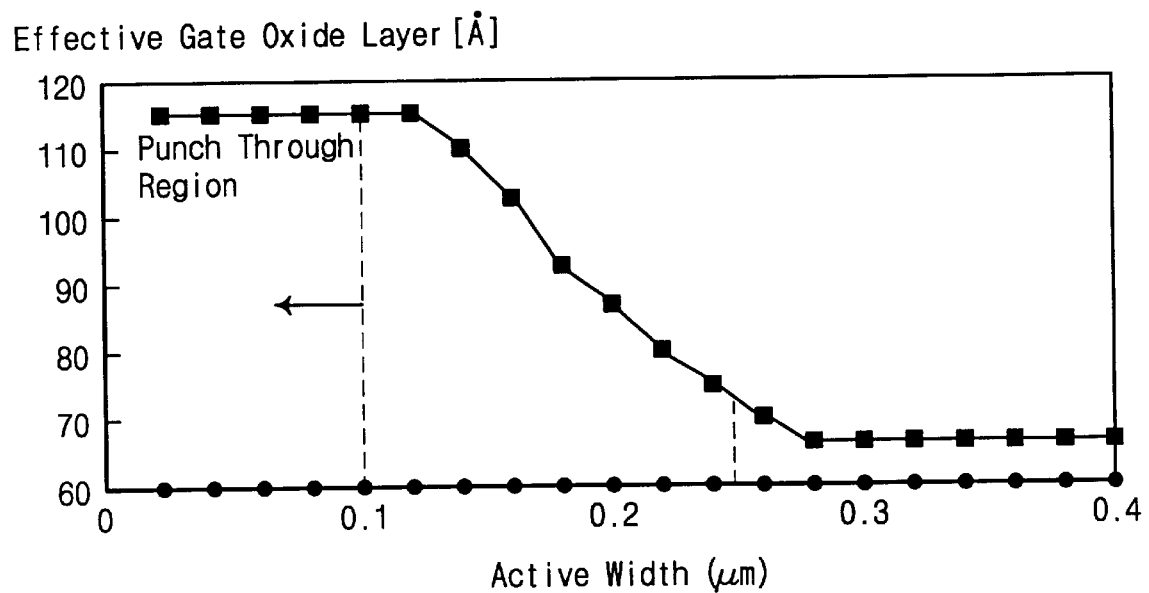
FIG. 11 is a graph showing the relationship between the thickness variation of the effective gate oxide and the active width.

To better understand the current invention, FIG. 11 is provided which shows the relationship between the thickness variation of the effective gate oxide and the active width under the fixed gate pattern size by using the T-SUPREM4 and MEDICI (procell & device simulator). This simulation method was carried out under the condition that the gate pattern size is fixed at 0.2 microns and the wet oxidation is carried out on the bare wafer having 60 Å oxide layer at a temperature about 780° C. for 25 minutes in a 10 liter $H_2O$ atmosphere. If the active width is more than 0.25 microns, the thickness variation is about 7 Å due to small gate pattern size. If the active width decreases from 0.2 microns to in the range between 0.25 microns and 0.1 microns, the oxide thickness significantly increases due to the bird's beak phenomenon. If the active width is less than 0.1 microns, the bird's beak phenomenon becomes so severe as to cause a bird's beak punchthrough (oxidant punchthrough) phenomenon. As a result, the stress to suppress the oxidation is not formed and the oxide grows increasingly up to about 115 Å. This bird's beak punchthrough (oxidant punchthrough) region can be adjusted dependent on the wet oxidation condition (i.e., it can be shifted to a desired region).

The following equations (i.e., oxidation mechanism) will explain the bird's beak punchthrough (oxidant punchthrough) phenomenon. For these equations, it is assumed that the silicon surface has a concave contour.

Stress ($\sigma_x$) in the silicon-silicon oxide interface is given by the equation:

$$\sigma_x = \eta \xi (1/a^2 - 1/b^2) \quad (1)$$

where $\eta$ is the oxide viscosity; $\xi$ is a velocity constant determined by an oxide growth rate in the interface; and a and b represent the radius of coverture of the oxide layer, measured respectively at an upper surface and lower surface (facing the silicon substrate).

The oxide bulk hydrostatic pressure (P) is given by the equation:

$$P = \pm 2\eta \xi (1/b^2) \quad (2)$$

The diffusivity constant (D) by stress is given by the equation:

$$D = D_0^* e^{-\frac{P^* V_0}{kT}} \quad (3)$$

where $D_o^*$ represents the oxidant diffusivity at an initial normal state; P* represents the pressure of the of the bulk oxide layer at the initial normal state; $V_0$ represents the degree of dependent oxidant diffusivity with respect to the pressure within the oxide layer; k represents the Boltzmann constant; and T represents the absolute temperature in degrees Kelvin.

The solubility (C*) is given by the equation:

$$C = C_0^* e^{-\frac{P^* V_s}{kT}} \quad (4)$$

where $C_0^*$ represents the oxidant solubility at the initial normal state; and $V_s$ represents the oxidant solubility with respect to pressure.

The surface reaction rate ($k_s$) is given by the equation:

$$k_s = k_0 e^{\frac{-\sigma_x (\Omega_{SiO2} - \Omega_{Si})}{kT}} \quad (5)$$

where $k_0$ represents a reaction rate at a normal state; $\eta_x$ represents the stress caused by oxide growth; $\Omega_{SiO2}$ is the molecular volume of $SiO_2$; and $\Omega_{Si}$ is the atomic volume of Si.

Since a 60Ω oxide layer is formed beneath the gate pattern along the gate length (or active length) direction, stress is caused by a volume expansion during the oxidation process. This stress, in turn, allows for a significant reduction in oxidant diffusivity, and so the increase in the oxide thickness is low. On the other hand, a thick field oxide layer is formed beneath the gate pattern along the active width, because the reduction of the oxidant diffusivity by volume expansion during the oxidation process is very low. As a result, the gate oxide layer grows thickly along the active width direction.

It is noted that this invention performs wet oxidation after the formation of the insulating spacers so as to intensify the influence of the active width during oxidation. In other words, the insulating spacers serve to block the oxidation path.

Wet oxidation is preferably selected as the oxidation ambient because wet oxidation has a high solubility (more than 600 times as high as dry oxidation) and ambient water reacts with Si—O to form hydroxyl groups which break down the $SiO_2$ and thereby reduce its viscosity. This reduces THE bulk oxide stress mentioned above and so increases the oxidation rate.

While this invention has been particularly shown and described with reference to a preferred embodiment, it will be understood by those skilled in the art that various changes in form and details may be made without departing from the spirit and scope of this invention.

What is claimed is:

1. A method for fabricating a semiconductor device, comprising:

providing a semiconductor substrate having a first region and a second region;

forming a device isolating layer over both the first region and the second region of the semiconductor substrate to define a first active region in the first region and a second active region in the second region, the second active region being wider than the first active region;

forming a gate oxide layer over the first and second active regions of the semiconductor substrate;

forming a patterned gate electrode over the gate oxide layer;

performing a dry oxidation to grow a first oxide layer over a portion of the semiconductor substrate not covered by the patterned gate electrode;

partially etching the first oxide layer such that the portion of the first oxide layer over the semiconductor substrate and not covered by the patterned gate electrode is thinner than the gate oxide layer; and performing a wet oxidation to grow a patterned oxide layer that is thicker in the first region than it is in the second region.

2. A method for fabricating a semiconductor device, as recited in claim 1, farther comprising forming insulating spacers on sidewalls of the patterned gate electrode after partially etching the first oxide layer, but before performing a wet oxidation.

3. A method for fabricating a semiconductor device, as recited in claim 2, wherein the insulating spacers comprise an oxide layer.

4. A method for fabricating a semiconductor device, as recited in claim 1, wherein the first region is a cell array region of a memory device and the second region is a peripheral region of the memory device.

5. A method for fabricating a semiconductor device, as recited in claim 1, wherein the second active region has a second width at least two times as wide as a first width of the first region.

6. A method for fabricating a semiconductor device, as recited in claim 5, wherein the first width is 0.2 µm or less, the second width is 0.4 µm or more.

7. A method for fabricating a semiconductor device, as recited in claim 1, wherein the step of partially etching the first oxide layer is carried out by either dry etching or wet etching.

8. A method for fabricating a semiconductor device, as recited in claim 1, wherein the step of wet oxidation is performed at a temperature in the range of about 700° C. to 850° C.

9. A method for fabricating a semiconductor device, as recited in claim 1, wherein the patterned oxide layer is 30% thinner in the second region than it is in the first region.

10. A method for fabricating a semiconductor device, as recited in claim 1, wherein the first region is supplied with a first voltage higher than a second voltage applied to the second region.

11. A method for fabricating a semiconductor device, as recited in claim 1, wherein the performing of a dry oxidation also grow the first oxide layer on both sidewalls of the patterned gate electrode.

* * * * *